US006793733B2

(12) United States Patent
Janakiraman et al.

(10) Patent No.: US 6,793,733 B2
(45) Date of Patent: Sep. 21, 2004

(54) GAS DISTRIBUTION SHOWERHEAD

(75) Inventors: Karthik Janakiraman, Sunnyvale, CA (US); Nitin Ingle, Campbell, CA (US); Zheng Yuan, Fremont, CA (US); Steven Gianoulakis, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/057,280

(22) Filed: Jan. 25, 2002

(65) Prior Publication Data

US 2003/0140851 A1 Jul. 31, 2003

(51) Int. Cl.[7] .............................................. C23C 16/00
(52) U.S. Cl. .................................. 118/715; 156/345.34
(58) Field of Search ...................... 118/715; 156/345.33, 156/345.34

(56) References Cited

U.S. PATENT DOCUMENTS

| | | | |
|---|---|---|---|
| 4,297,162 A | | 10/1981 | Mundt et al. |
| 4,590,042 A | * | 5/1986 | Drage ................... 156/345.34 |
| 4,854,263 A | | 8/1989 | Chang et al. |
| 4,892,753 A | | 1/1990 | Wang et al. |
| 5,439,524 A | * | 8/1995 | Cain et al. ................... 118/715 |
| 5,589,002 A | * | 12/1996 | Su .......................... 118/723 E |
| 5,597,439 A | | 1/1997 | Salzman |
| 5,728,223 A | * | 3/1998 | Murakami et al. ........... 118/715 |
| 5,976,261 A | | 11/1999 | Moslehi et al. |
| 5,980,686 A | | 11/1999 | Goto |
| 6,001,175 A | | 12/1999 | Maruyama et al. |
| 6,050,506 A | | 4/2000 | Guo et al. |
| 6,079,353 A | * | 6/2000 | Leksell et al. .............. 118/715 |
| 6,206,972 B1 | | 3/2001 | Dunham |
| 6,232,580 B1 | | 5/2001 | Sandhu |
| 6,245,192 B1 | | 6/2001 | Dhindsa et al. |
| 6,267,074 B1 | | 7/2001 | Okumura |
| 6,302,965 B1 | * | 10/2001 | Umotoy et al. ............. 118/715 |
| 6,436,193 B1 | * | 8/2002 | Kasai et al. ................. 118/715 |
| 6,454,860 B2 | * | 9/2002 | Metzner et al. ............. 118/715 |
| 6,565,661 B1 | * | 5/2003 | Nguyen ...................... 118/715 |
| 6,586,886 B1 | * | 7/2003 | Katz et al. ............... 315/111.21 |
| 6,677,712 B2 | * | 1/2004 | Katz et al. ............... 315/111.21 |
| 2002/0000196 A1 | * | 1/2002 | Park ............................ 118/715 |
| 2002/0007790 A1 | * | 1/2002 | Park ............................ 118/715 |
| 2002/0011215 A1 | * | 1/2002 | Tel et al. ............ 118/723 MW |
| 2003/0019428 A1 | * | 1/2003 | Ku et al. ..................... 118/715 |
| 2003/0089314 A1 | * | 5/2003 | Matsuki et al. ............. 118/715 |
| 2003/0111961 A1 | * | 6/2003 | Katz et al. ............... 315/111.21 |
| 2003/0140851 A1 | * | 7/2003 | Janakiraman et al. ....... 118/715 |
| 2003/0168006 A1 | * | 9/2003 | Williams .................... 118/300 |
| 2003/0201723 A1 | * | 10/2003 | Katz et al. ............... 315/111.21 |
| 2004/0060514 A1 | * | 4/2004 | Janakiraman et al. ....... 118/715 |

FOREIGN PATENT DOCUMENTS

| | | | |
|---|---|---|---|
| JP | 01 283375 A | | 11/1989 |
| JP | 01-294868 A | * | 11/1989 |
| JP | 11 176593 A | | 7/1999 |

* cited by examiner

*Primary Examiner*—Jeffrie R. Lund
(74) *Attorney, Agent, or Firm*—Townsend and Townsend and Crew LLP

(57) ABSTRACT

A gas distribution showerhead for use in a semiconductor fabrication process features a face plate having gas outlet ports in the form of elongated slots or channels. The use of elongated gas outlet ports in accordance with embodiments of the present invention substantially reduces the incidence of undesirable spotting and streaking of deposited material where the showerhead is closely spaced from the wafer. A showerhead featuring a face plate having a tapered profile to reduce edge thickness of deposited material at close face plate-to-wafer spacings is also disclosed.

8 Claims, 14 Drawing Sheets

GAS DISTRIBUTION SHOWERHEAD

BACKGROUND OF THE INVENTION

Embodiments in accordance with the present invention generally relate to methods and apparatuses for use in the fabrication of semiconductor devices, and in particular to gas distribution showerheads employed in high temperature deposition processes.

High temperature chemical vapor deposition (CVD) processes have encountered widespread use in the semiconductor industry. FIG. 1A shows a simplified cross-sectional view of a conventional apparatus for performing high temperature chemical vapor deposition. For purposes of illustration, FIG. 1A, an other figures of present application, are not drawn to scale.

Apparatus 100 comprises wafer support structure 104 housed within deposition chamber 105. A wafer 102 may be placed upon support structure 104 during substrate processing.

Gas distribution showerhead 106 is positioned above wafer 102 and is separated from wafer 102 by gap Y. The magnitude of gap Y for a particular application may be controlled by adjusting the height of wafer support structure 104 relative to showerhead 106. For example, during conventional deposition of undoped silicate glass (USG) materials, gap Y may be greater than about 300 mils.

Gas distribution showerhead 106 comprises process gas inlet 108 in fluid communication with blocker plate 110 having apertures 112. Gas distribution face plate 114 is positioned downstream of blocker plate 110. Face plate 114 receives a flow of process gas from blocker plate 110 and flows this gas through holes 116 to wafer 102. Layer 118 of deposited material is formed over wafer 102 as a result of the flow of process gases.

FIG. 1B shows a bottom perspective view of the conventional gas distribution face plate 114 of FIG. 1A. Holes 116 of face plate 114 are distributed over the surface of the face plate. FIG. 1B shows only one example of the distribution of holes 116 on a face plate, and many other arrangements of holes on a face plate are possible.

Referring again to FIG. 1A, the role of blocker plate 110 is to coarsely distribute incoming process gas stream 120 over the inlet side 114a of face plate 114. Face plate 114 in turn distributes the gas stream to produce a uniform, finely distributed flow that is exposed to wafer 102. As a result of exposure to this finely-distributed flow of processing gas, high quality layer 118 of deposited material is formed over wafer 102.

The conventional high temperature deposition apparatus shown in FIGS. 1A–1B is effective to create structures on the surface of a semiconductor wafer. One type of structure formed by high temperature CVD is shallow trench isolation (STI). FIG. 2 shows an enlarged cross-sectional view of wafer 200 bearing semiconductor structures 202 such as active transistors. Adjacent active semiconductor devices 202 are electronically isolated from one another by STI structures 204 comprising trenches filled with dielectric material such as undoped silicate glass (USG).

STI structures are formed by masking and etching exposed regions of a wafer to create trenches. The mask is then removed and USG is deposited over the wafer using a high temperature process, including within the trenches. USG deposited outside of the trenches may subsequently be removed by etching or chemical mechanical polishing (CMP) to reveal the final STI structures.

The conventional apparatus shown in FIGS. 1A–1B has been successfully utilized to deposit materials such as USG at high temperatures, for STI and other applications. However, improvements in the design of the high temperature deposition apparatus are desirable. For example, it is known that faster deposition rates may be achieved by spacing the showerhead closer to the wafer. A faster deposition rate will enhance throughput of the deposition apparatus, thereby enabling an operator to more quickly recoup costs of purchasing and maintaining the device.

However, closer spacing of the wafer relative to the showerhead can result in the deposited material exhibiting uneven topography visible as spotting or streaking on the wafer. The topography of material deposited at such close wafer-to-showerhead spacings may reflect the location of holes on the faceplate.

FIGS. 3A–3B are photographs illustrating the results of deposition of material in accordance with embodiments of the present invention. FIG. 3A is a photograph showing a wafer bearing a USG film deposited from a conventional showerhead with a face plate-to-wafer spacing of 75 mils. The wafer of FIG. 3A shows significant spots and streaking.

FIG. 3B is a photograph showing a wafer bearing a USG film deposited from a conventional showerhead with a face plate-to-wafer spacing of 50 mils. The wafer of FIG. 3B shows even more pronounced spotting and streaking than the wafer of FIG. 3A.

Accordingly, methods and structures permitting application of processing gases at a close proximity to the surface of a substrate are desirable.

SUMMARY OF THE INVENTION

A gas distribution showerhead for semiconductor fabrication applications includes a face plate having gas outlet ports in the form of elongated slots or channels rather than discrete holes. The use of elongated gas outlet ports in accordance with embodiments of the present invention substantially reduces the incidence of undesirable spotting and streaking of deposited material where the showerhead is closely spaced from the wafer. A showerhead having a tapered profile to reduce edge thickness of deposited material is also disclosed.

An embodiment of an apparatus for forming a material on a semiconductor wafer comprises a processing chamber defined by walls, a processing gas supply, and a wafer support positioned within the processing chamber and configured to receive a semiconductor wafer. A gas distribution showerhead overlies and is separated from the wafer support, the gas distribution showerhead comprising a face plate having an inlet portion comprising a hole in fluid communication with an elongated slot of an outlet portion of the face plate, a length of the elongated slot at least twice a thickness of the face plate.

An embodiment of a gas distribution face plate in accordance with the present invention comprises a face plate body having a thickness. An inlet portion of the face plate is configured to receive a flow of a processing gas, the inlet portion comprising an aperture having a width. An outlet portion of the face plate is configured to convey the processing gas flow to a semiconductor wafer, the outlet portion comprising an elongated slot in fluid communication with the aperture, the elongated slot having a length at least twice the thickness of the face plate body.

An apparatus for forming a material on a semiconductor wafer, the apparatus comprising a processing chamber defined by walls; a processing gas supply, and a wafer support positioned within the processing chamber and configured to receive a semiconductor wafer. A gas distribution showerhead overlies the wafer support and includes a tapered face plate proximate to the wafer support, an edge of the tapered face plate exhibiting a reduced thickness relative to a thickness of a center of the face plate, such that material deposited on a wafer in contact with the wafer support exhibits a uniform center-to-edge thickness.

A method of distributing gas during a semiconductor fabrication process comprising flowing a gas from a gas source to an inlet portion of a gas distribution face plate featuring a hole having a width, and flowing the gas from the hole to a surface of a semiconductor wafer through an elongated slot of an outlet portion of a gas distribution face plate, the elongated slot having a length at least twice a thickness of the gas distribution face plate.

These and other embodiments of the present invention, as well as its features and some potential advantages are described in more detail in conjunction with the text below and attached figures.

DESCRIPTION OF THE SPECIFIC EMBODIMENTS

An embodiment of a gas distribution showerhead in accordance with the present invention includes a face plate having gas outlet ports in the form of elongated slots or channels. The use of elongated gas outlet ports in accordance with embodiments of the present invention substantially reduces the incidence of undesirable spotting and streaking of deposited material at close face plate-to-wafer spacings. A showerhead having a tapered profile to reduce edge thickness of deposited material is also disclosed.

Figure 4A:
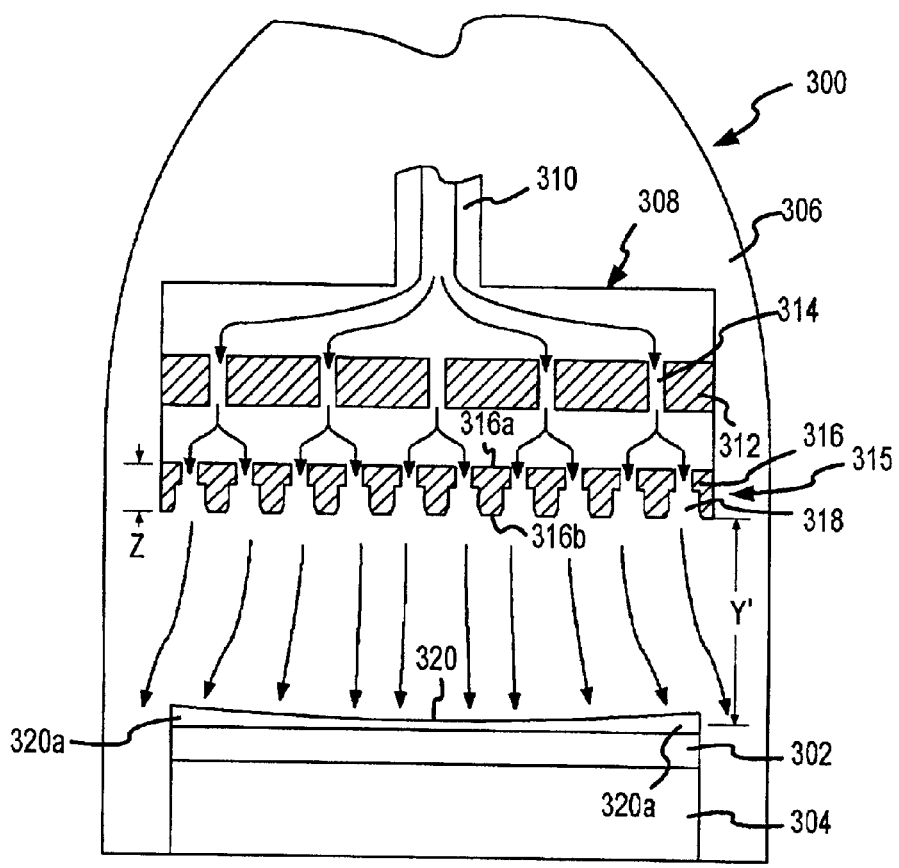
FIG. 4A is a simplified cross-sectional view of a high temperature deposition system in accordance with one embodiment of the present invention.

FIG. 4A shows a simplified cross-sectional view of one embodiment of a chemical vapor deposition system in accordance with the present invention. Apparatus 300 comprises wafer 302 in contact with wafer support structure 304 and housed within deposition chamber 306. Gas distribution showerhead 308 is positioned above wafer 302 and is separated from wafer 302 by gap Y'.

Gas distribution showerhead 308 comprises process gas inlet 310 in fluid communication with blocker plate 312 having apertures 314. Gas distribution face plate 316 having a body 315 of thickness Z is positioned downstream of blocker plate 312. Face plate 316 receives a flow of process gas from blocker plate 312 and flows this gas through apertures 318 in body 315 to wafer 302.

For purposes of illustration of the entire deposition apparatus, FIG. 4A is simplified to show apertures 318 having a constant cross-sectional profile. However, U.S. Pat. No. 4,854,263, commonly assigned to the assignee of the instant application, discloses the value of face plate apertures exhibiting an increase in cross-section transverse to the direction of gas flow.

Figure 4B:
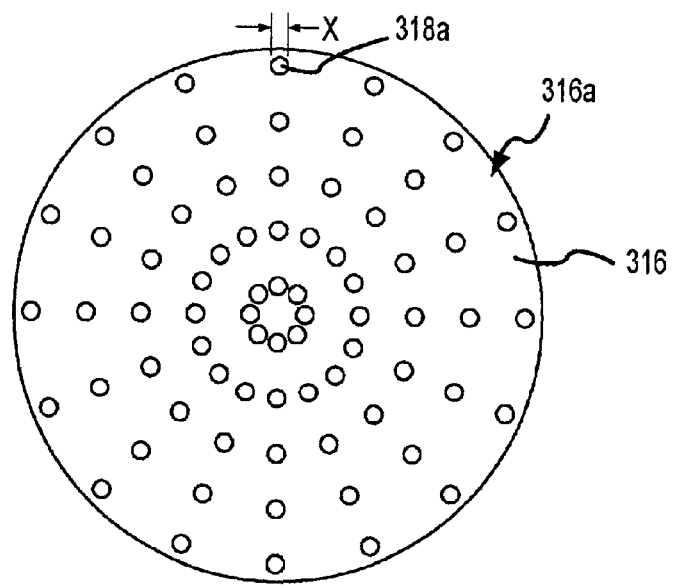
FIG. 4B is a top view of one embodiment of a face plate for a gas distribution showerhead in accordance with the present invention.
Figure 4C:
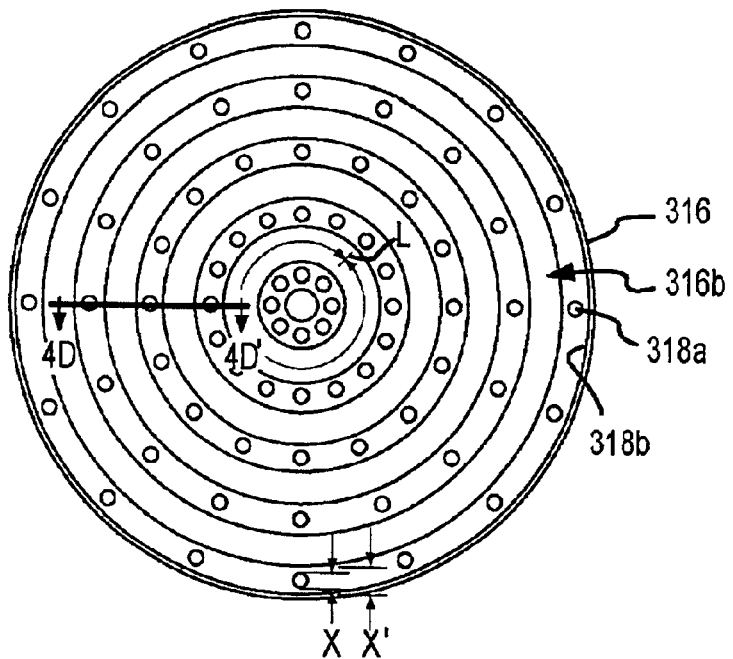
FIG. 4C is an underside view of one embodiment of a face plate for a gas distribution showerhead in accordance with the present invention.

FIG. 4B is a top (gas inlet) view of one embodiment of face plate 316 for a gas distribution showerhead in accordance with the present invention. FIG. 4C is an underside (gas outlet) view of one embodiment of face plate 316 for a gas distribution showerhead in accordance with the present invention.

As shown in FIG. 4B, gas inlet side 316a of face plate 316, receiving a flow of the coarsely distributed process gas from the blocker plate, includes a plurality of discrete holes 318a of diameter X. As shown in FIG. 4C, gas outlet side 316b of face plate 316, conveying the finely distributed process gas from the faceplate to the wafer, includes a plurality of continuous elongated slots 318b of length L. Elongated slots 318b may receive a gas flow from more than one discrete hole 318a. It has been found that provision of elongated slots having a length L of at least one-half the thickness Z of face plate 316, allows face plate 316 to be positioned close to the surface of the wafer without causing deposited material to exhibit unwanted topographical features such as spots and streaking.

Figure 4D:
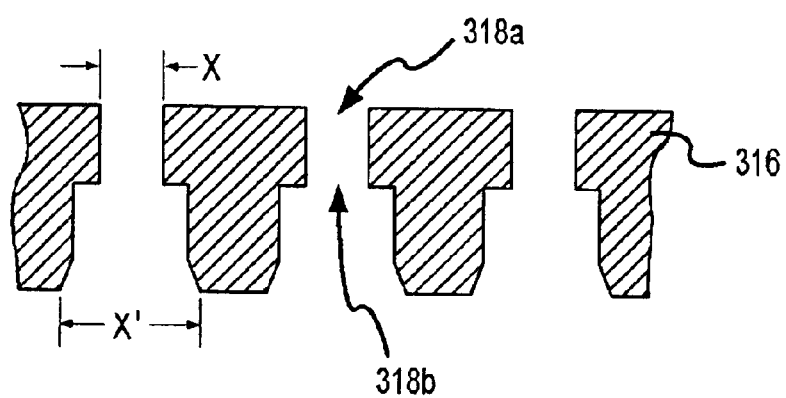
FIG. 4D is an enlarged cross-sectional view of the face plate of FIGS. 4A–4B.

FIG. 4D shows an enlarged cross-sectional view of the face plate of FIGS. 4A–4C. FIG. 4D shows that for the particular embodiment illustrated, cross-sectional width X of holes 318a on flow inlet portion 316a are substantially more narrow than cross-sectional width X' of elongated slots 318b on flow outlet portion 316b. Embodiments of the present invention may utilize elongated face plate slots having a ratio of X'/X of 2.25 or greater.

Figure 1A:
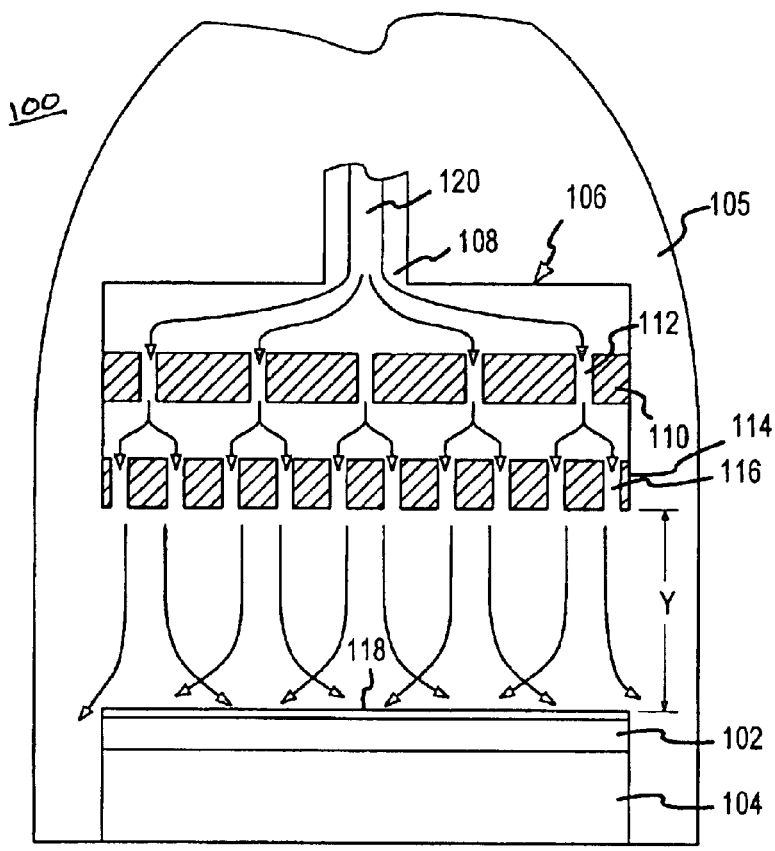
FIG. 1A is a simplified cross-sectional view of a conventional high temperature deposition system.
Figure 1B:
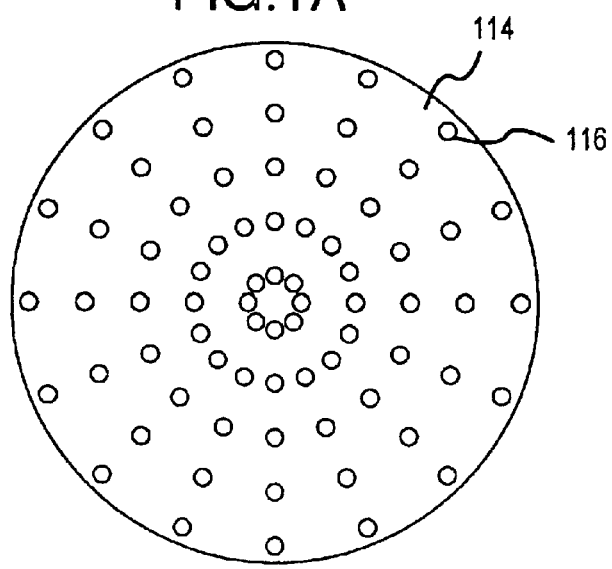
FIG. 1B is a bottom perspective view of the face plate of the conventional gas distribution showerhead of the system of FIG. 1A.
Figure 2:
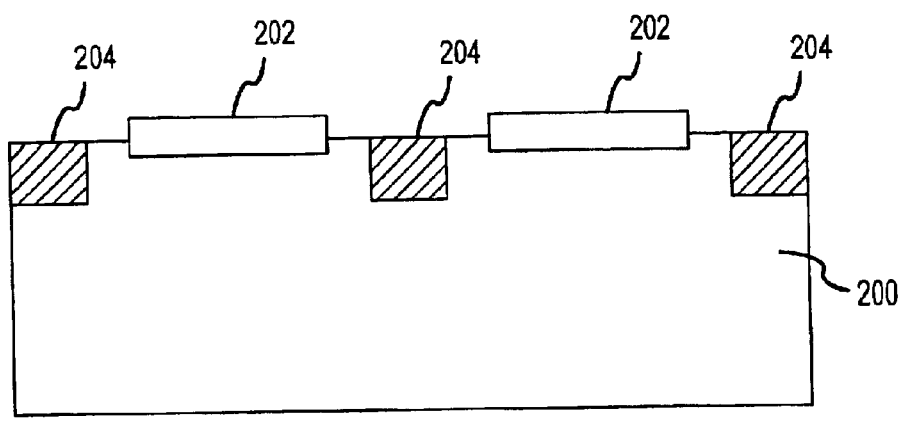
FIG. 2 shows a cross-sectional view of a conventional shallow trench isolation structure.
Figure 3A:
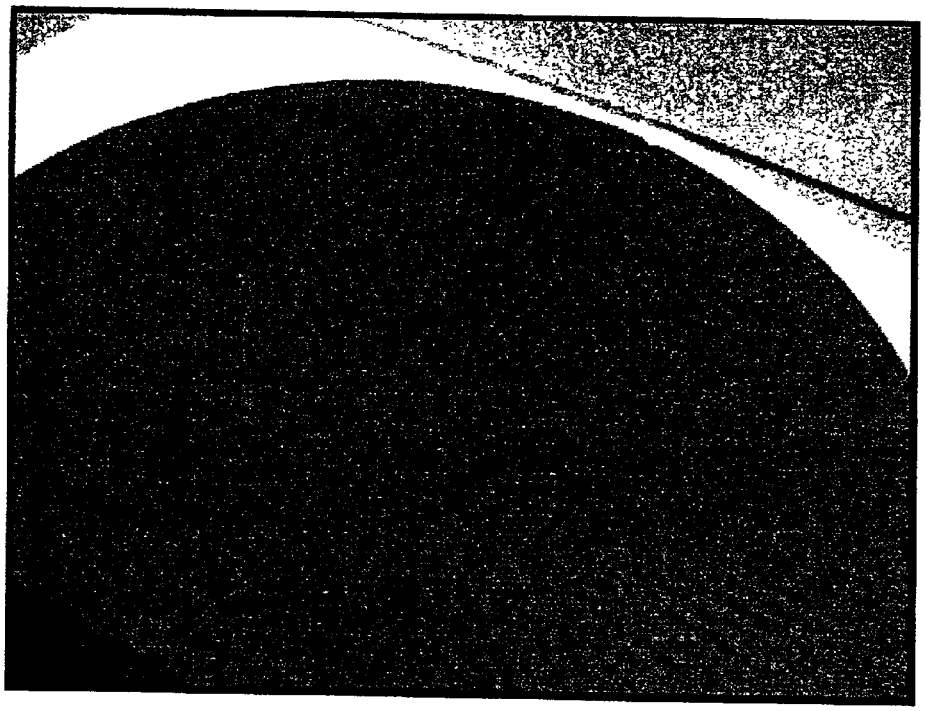
FIG. 3A is a photograph showing a wafer bearing a USG film deposited from a conventional showerhead with a face plate-to-wafer spacing of 75 mils.
Figure 5A:
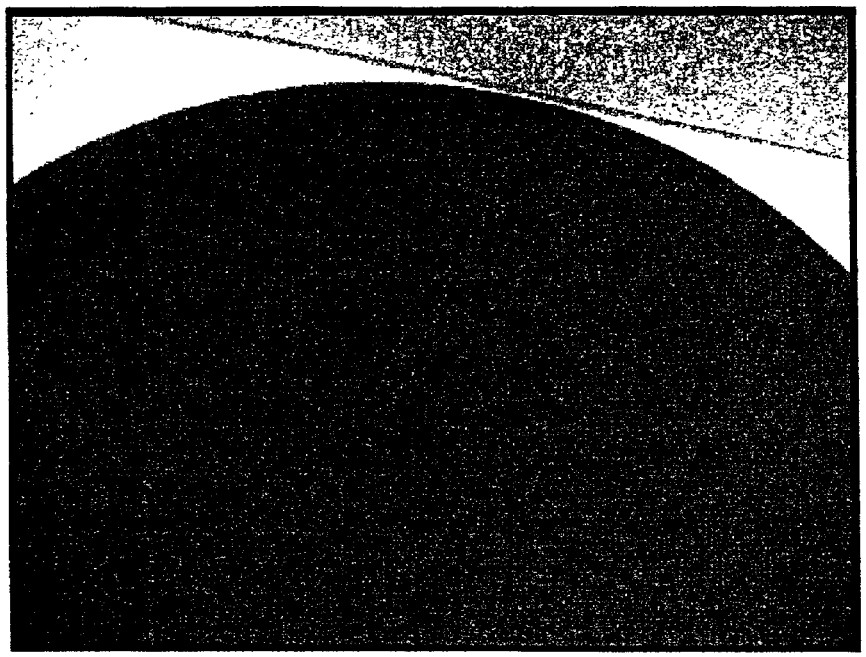
FIG. 5A is a photograph showing a wafer bearing a USG film deposited from a showerhead in accordance with an embodiment of the present invention with a face plate-to-wafer spacing of 75 mils.
Figure 5B:
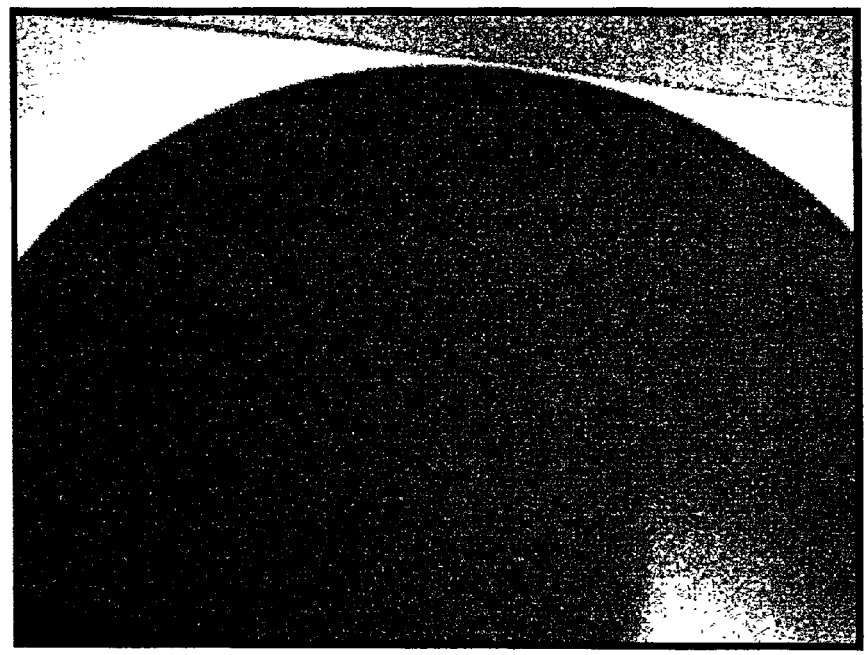
FIG. 5B is a photograph showing a wafer bearing a USG film deposited from a showerhead in accordance with an embodiment of the present invention with a face plate-to-wafer spacing of 50 mils.

FIGS. 5A–5B are photographs illustrating the results of deposition of material in accordance with embodiments of the present invention. FIG. 5B is a photograph showing a wafer bearing a USG film deposited from a showerhead in accordance with an embodiment of the present invention, with a face plate-to-wafer spacing of 75 mils. The wafer of FIG. 5A exhibits substantially less spotting and streaking than the wafer resulting from deposition at the same spacing utilizing a conventional showerhead, shown in FIG. 3A.

Figure 3B:
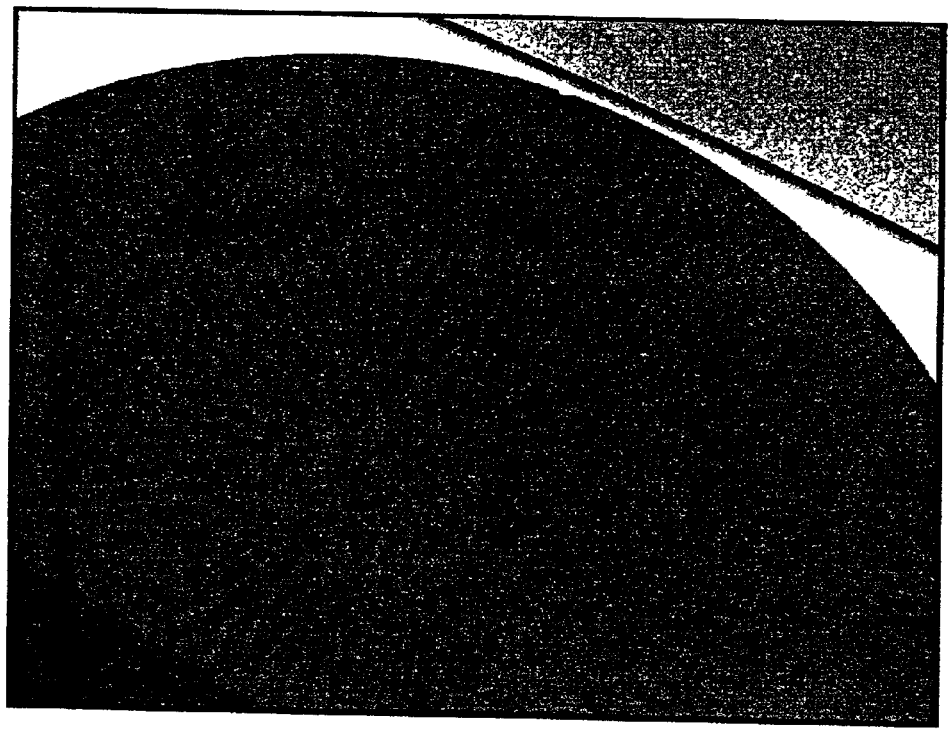
FIG. 3B is a photograph showing a wafer bearing a USG film deposited from a conventional showerhead with a face plate-to-wafer spacing of 50 mils.

FIG. 5B is a photograph showing a wafer bearing a USG film deposited from a showerhead in accordance with an embodiment of the present invention with a face plate-to-wafer spacing of 50 mils. The wafer of FIG. 5B exhibits substantially less spotting than the wafer resulting from deposition at the same spacing utilizing a conventional showerhead, shown in FIG. 3B.

Figure 6A:
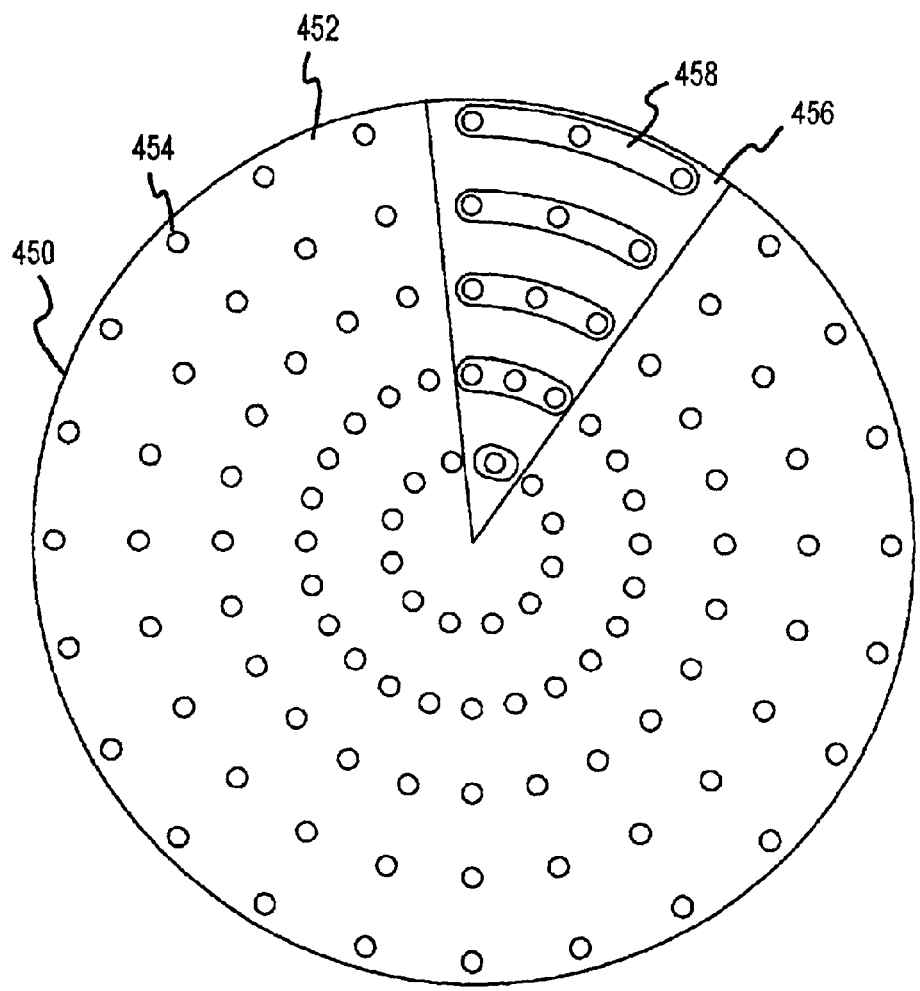
FIG. 6A is plan view of a composite face plate bearing both holes and elongated slots.

During development of the present invention, a composite face plate bearing both conventional holes and elongated slotted openings was utilized to deposit USG on a wafer. FIG. 6A shows a simplified plan view of this composite showerhead 450, which comprises first region 452 including conventional holes 454, and also comprises second region 456 including elongated slots 458 in accordance with embodiments of the present invention.

Figure 6B:
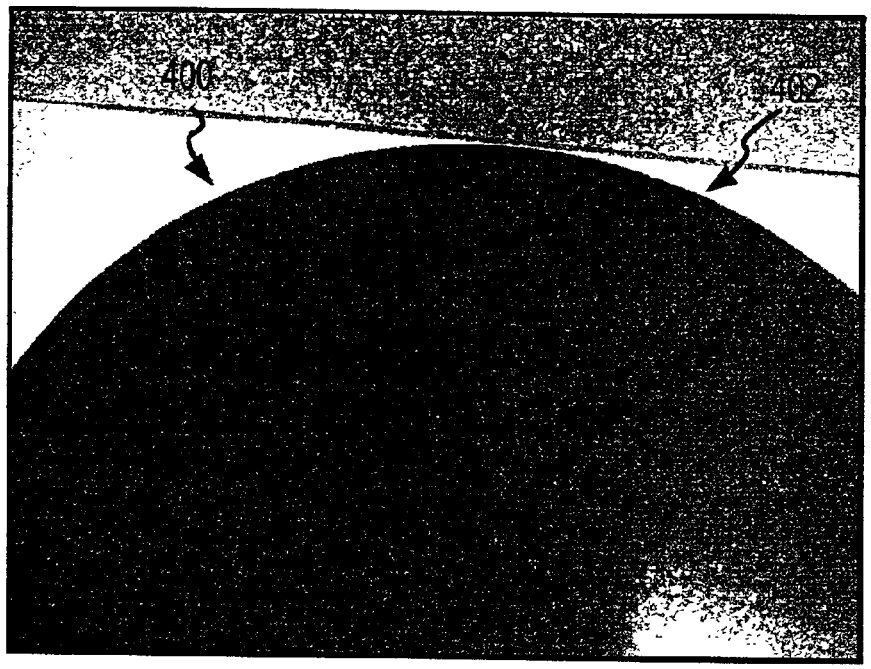
FIG. 6B is a photograph showing a wafer bearing a USG film deposited from a showerhead having a composite hole/slot configuration, at a face plate-to-wafer spacing of 75 mils.
Figure 6C:
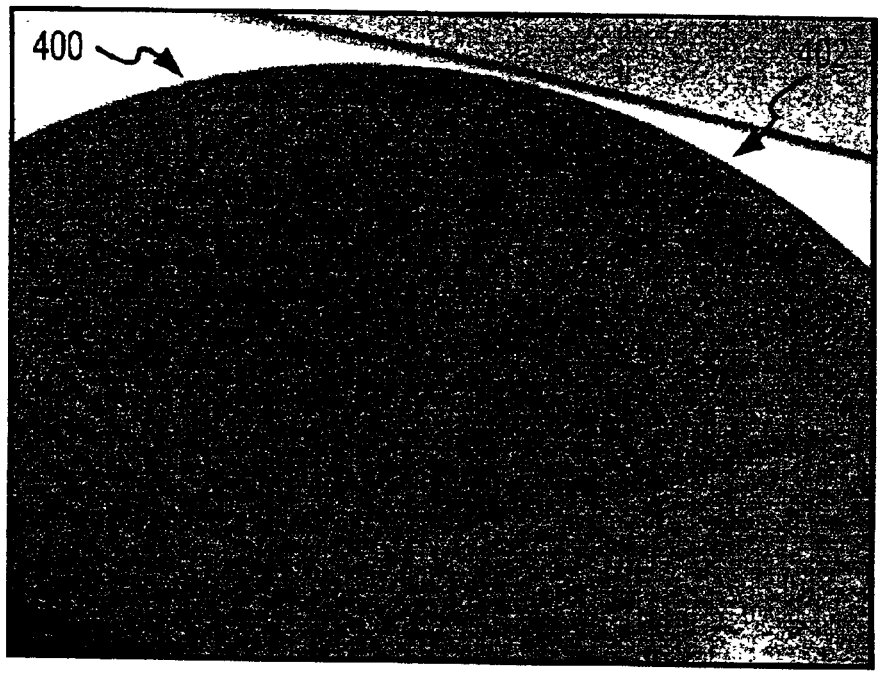
FIG. 6C is a photograph showing a wafer bearing a USG film deposited from a showerhead having a composite hole/slot configuration, at a face plate-to-wafer spacing of 50 mils.
Figure 7A:
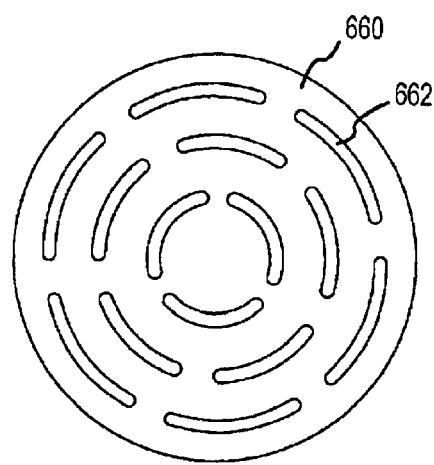
FIGS. 7A–7D show simplified plan views of face plates in accordance with alternative embodiments of the present invention bearing different patterns of elongated slots.
Figure 7B:
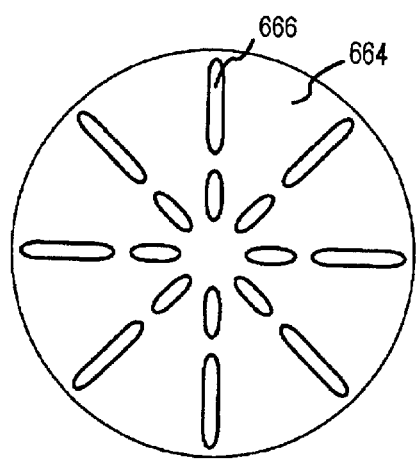
Figure 7D:
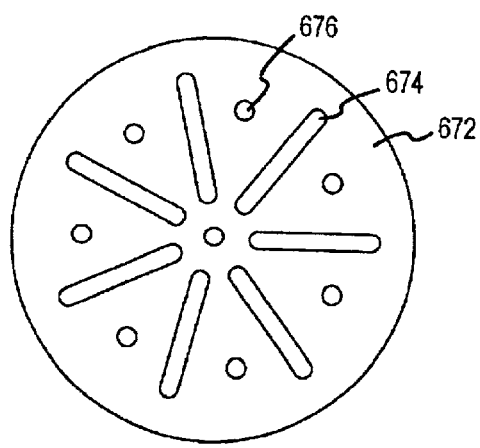
Figure 7C:
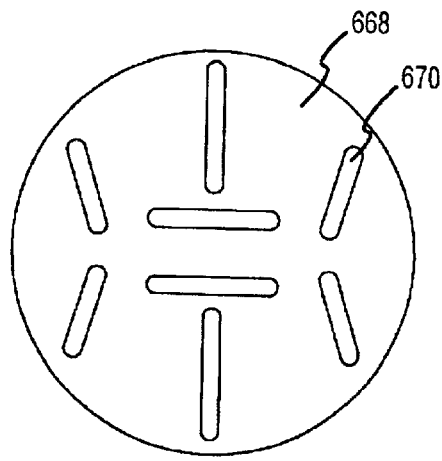

FIG. 6B is a photograph showing a wafer bearing a USG film deposited from the composite showerhead of FIG. 6A at a face plate-to-wafer spacing of 75 mils. FIG. 6C is a photograph showing a wafer bearing a USG film deposited from a showerhead having a composite hole/slot configuration, at a face plate-to-wafer spacing of 50 mils. Both FIGS. 6B and 6C reveal that material 402 deposited through the elongated slots exhibits substantially smoother topography than material 400 deposited from the conventional holes of the composite face plate.

While the above figures illustrate a showerhead bearing a plurality of continuous, concentrically oriented slots on its outlet side, this particular configuration is not required by the present invention. Other configurations of elongated slots could be employed, and the showerhead would remain within the scope of the present invention.

FIGS. 7A–7D show simplified bottom views of the outlet portion of a variety of alternative embodiments of gas distribution face plates in accordance with the present invention, each bearing different orientations of elongated slots. Face plate outlet portion 660 of FIG. 7A bears a plurality of non-continuous slots 662 oriented in a circumferential direction. Face plate outlet portion 664 of FIG. 7B bears a plurality of non-continuous slots 666 oriented in a radial direction. Face plate outlet portion 668 of FIG. 7C bears a plurality of non-continuous slots 670 that are exclusively oriented neither concentrically nor in a radial direction. Face plate outlet portion 672 of FIG. 7D bears a plurality of non-continuous slots 674 in combination with conventional holes 676.

Figure 8:
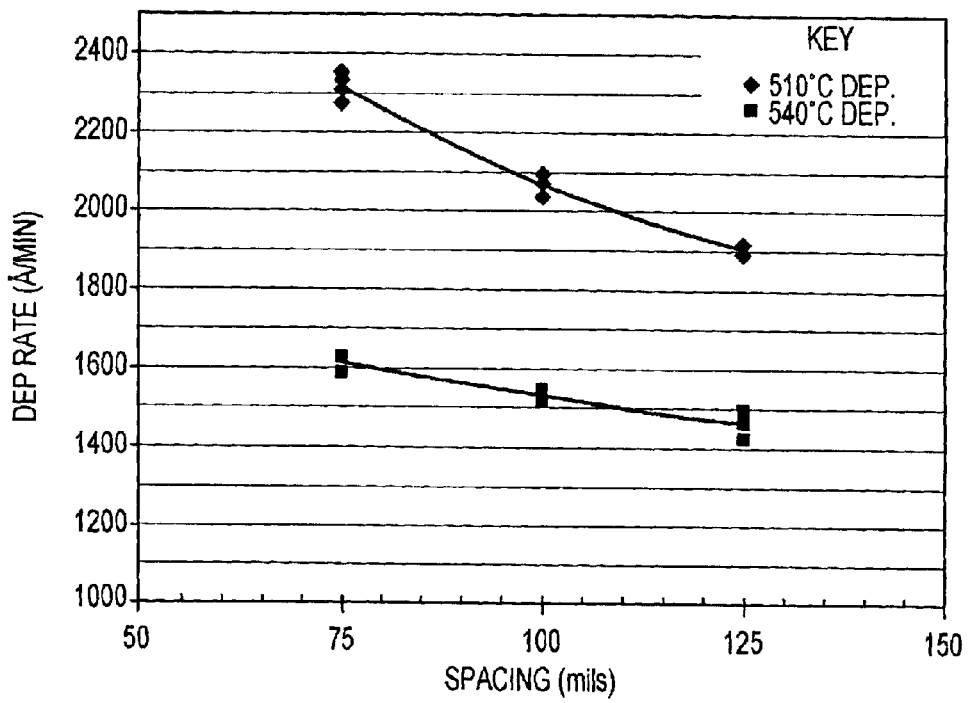
FIG. 8 plots deposition rate versus face plate-to-wafer spacing for USG deposition at different temperatures and pressures.

Embodiments of apparatuses and methods in accordance with the present invention offer a number of benefits. For example, FIG. 8 plots deposition rate versus face plate-to-wafer spacing for USG deposition processes at different temperatures. FIG. 8 shows that for deposition processes occurring at 510° C. or 540° C., a decrease in face plate-to-wafer spacing results in an increase in deposition rate. This relationship is more pronounced at closer face plate-to-wafer spacings.

Figure 9:
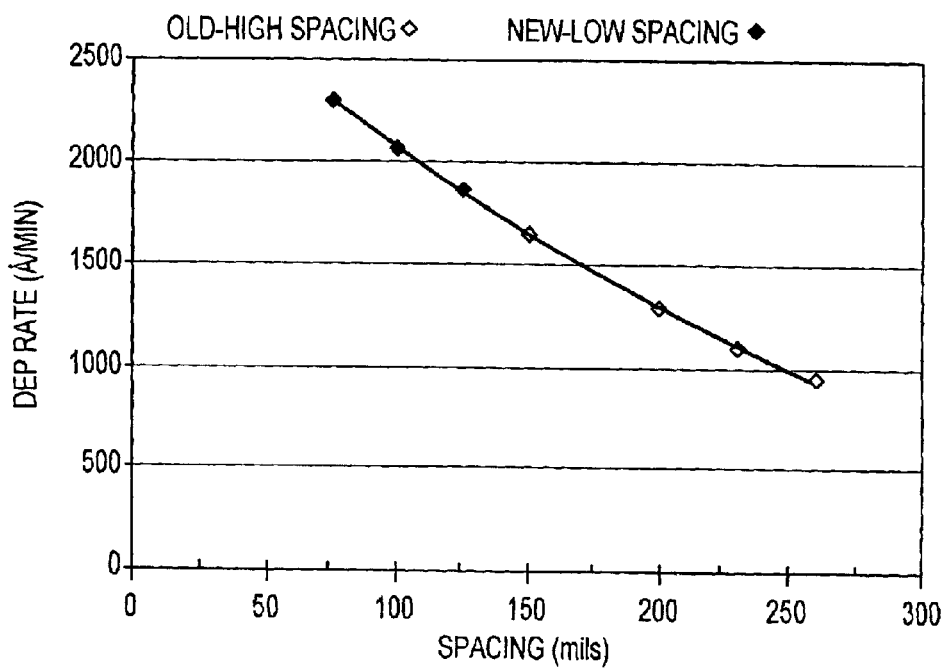
FIG. 9 plots deposition rate over a broad range of face plate-to-wafer spacings.

FIG. 9 plots USG deposition rate over a broader range (50–250 mils) of face plate-to-wafer spacings. FIG. 9 confirms the results of FIG. 8 over this broader range. Specifically, FIG. 9 indicates an increase in USG deposition rate at closer spacings, and also indicates a more pronounced effect upon deposition rate at closer spacings.

Figure 10:
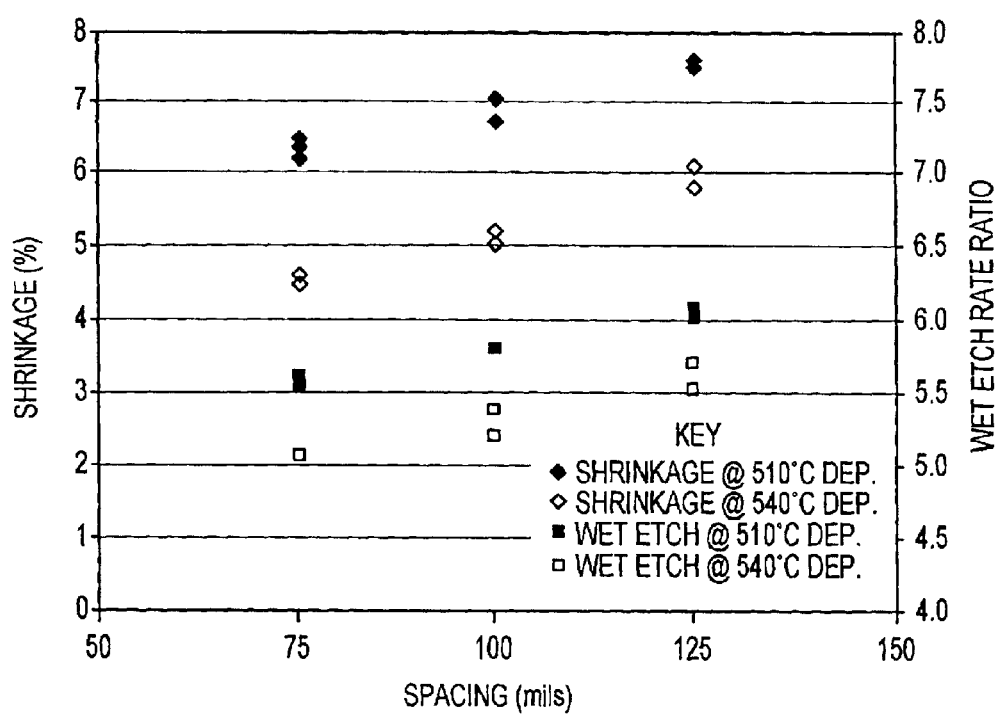
FIG. 10 plots % film shrinkage and wet etch selectivity versus face plate-to-wafer spacing for USG deposition processes at different temperatures and pressures.

FIG. 10 plots % film shrinkage and wet etch selectivity versus face plate-to-wafer spacing for USG deposition processes at different temperatures and pressures. FIG. 10 indicates that USG films deposited at both 510° C. and 540° C. exhibited low shrinkage when deposited at close face plate-to-wafer spacings. This data indicates formation of a denser higher quality film at close spacings.

The wet etch data of FIG. 10 correlates this finding of improved quality of layers deposited at close face plate-to-wafer spacings. Specifically, USG films deposited at closer face plate-to-wafer spacings exhibited a wet etch selectivity consistent with higher density.

Figure 11A:
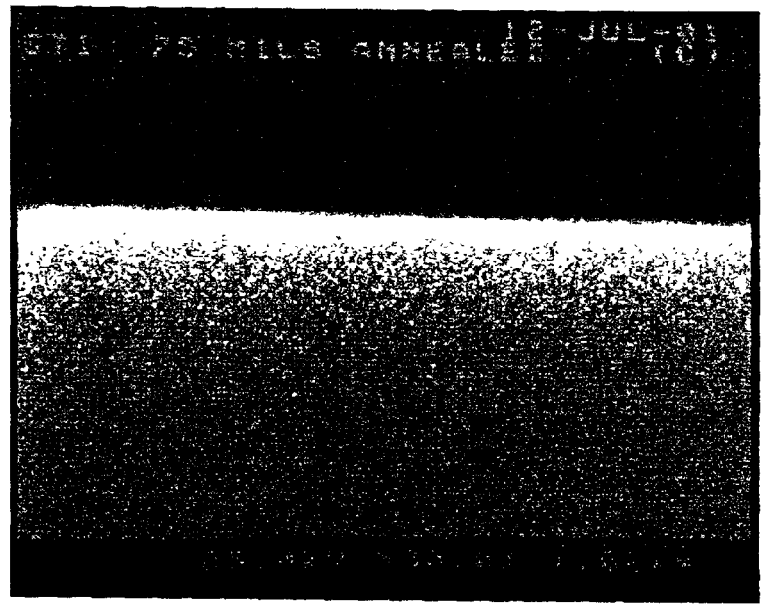
FIGS. 11A and 11B show photographs of cross-sections of shallow trench isolation structures formed by high temperature USG deposition utilizing a conventional showerhead and a showerhead in accordance with the present invention, respectively.
Figure 11B:
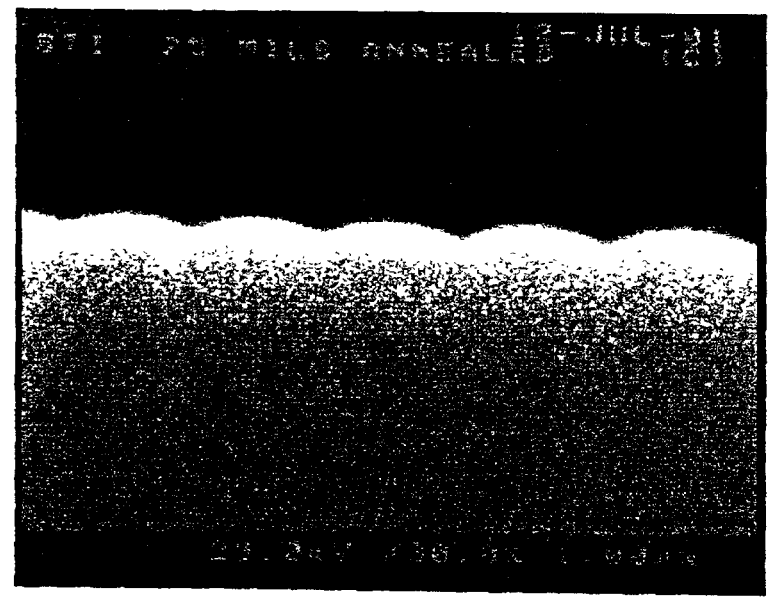

FIGS. 11A and 11B show photographs of cross-sections of shallow trench isolation structures formed by high temperature USG deposition utilizing a showerhead in accordance with the present invention. The USG deposition process shown in FIGS. 11A and 11B took place at temperatures of 510° C., with face plate-to-wafer spacings of 75 mils. The photographs show the USG filled shallow trench structures after a post-deposition anneal at 1050° C. for 60 min. FIGS. 11A and 11B show that a comparable quality in gap fill is achieved with the process in accordance with embodiments of the present invention as compared with processes employing conventional face plate designs.

While the invention has been described so far in connection with the flow of silicon-containing precursor gases employed in high temperature deposition of undoped silicate glass, the invention is not limited to this particular embodiment. A showerhead in accordance with embodiments of the present invention may be used to distribute a wide variety gases useful in an array of semiconductor fabrication processes, including but not limited to the chemical vapor deposition of doped silicon oxide in the form of phosphosilicate glass (PSG), borosilicate glass (BSG), or borophosphosilicate glass (BPSG).

Examples of gases that may be distributed utilizing a showerhead in accordance with an embodiment of the present invention include, but are not limited to, tetraethylorthosilane (TEOS), triethylphosphate (TEPO), and triethylborate (TEB). The invention is not limited to distributing the flow of precursor gases, and could be used to flow carrier gases such as He and $N_2$ that do not directly participate in a CVD reaction.

A showerhead in accordance with embodiments of the present invention may also be used to flow precursor gases for the formation of materials other silicon oxides, including but not limited to, metals, nitrides, and oxynitrides. And while the showerhead is described above in conjunction with a high temperature CVD process, embodiments in accordance with embodiments of the present invention may be utilized to flow gases in other types of CVD processes, such as plasma enhanced chemical vapor deposition (PECVD) processes or sub-atmospheric chemical vapor deposition (SACVD) processes.

Embodiments in accordance with the present invention are also not limited to use in conjunction with chemical vapor deposition processes. Showerheads in accordance with the present invention may also be employed to flow gases in other types of semiconductor fabrication processes, such as dry or plasma etching processes.

Embodiments in accordance with the present invention are also not limited to the utilization of a slotted showerhead face plate. Returning to FIG. 4A, one consequence of the close proximity of showerhead 308 relative to wafer 302 may be an increase in downward flow of process gases near the edges of the wafer. The resulting increase in mass flow to the wafer edges may give rise to increased edge thickness 320a of deposited material 320.

Figure 12:
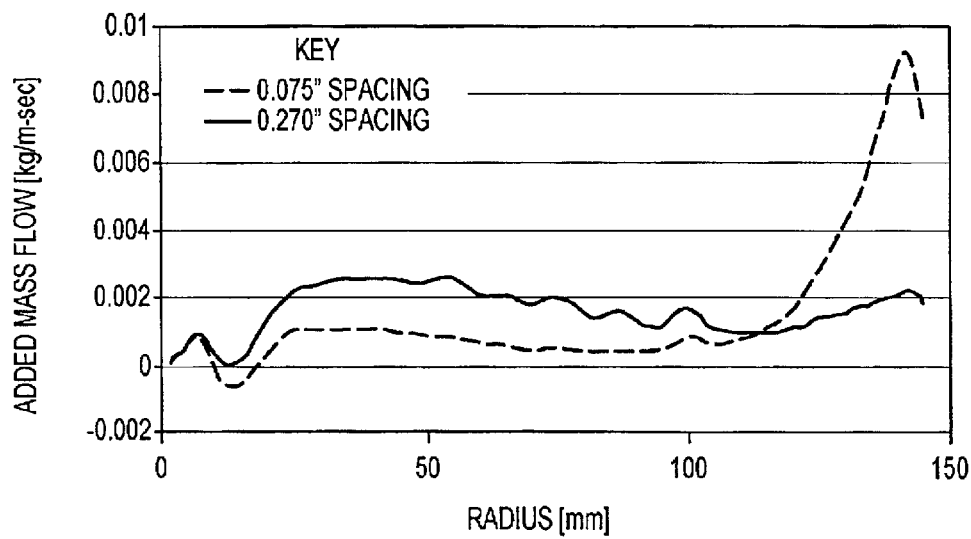
FIG. 12 plots calculated added mass flow versus distance from the center of the wafer for two face plate-to-wafer spacings.

FIG. 12 plots calculated added mass flow versus distance from the center of the wafer for two face plate-to-wafer spacings. At the conventional wide face plate-to-wafer spacing of 0.270", the deposition added mass flow that is relatively consistent from the center of the wafer to the edge. However, at a narrower face plate-to-wafer spacing of 0.075", the process exhibits a marked additional mass flow to peripheral regions of the wafer. This added mass flow may create a layer of deposited material having significantly greater thickness at its edges than at the center.

Figure 13:
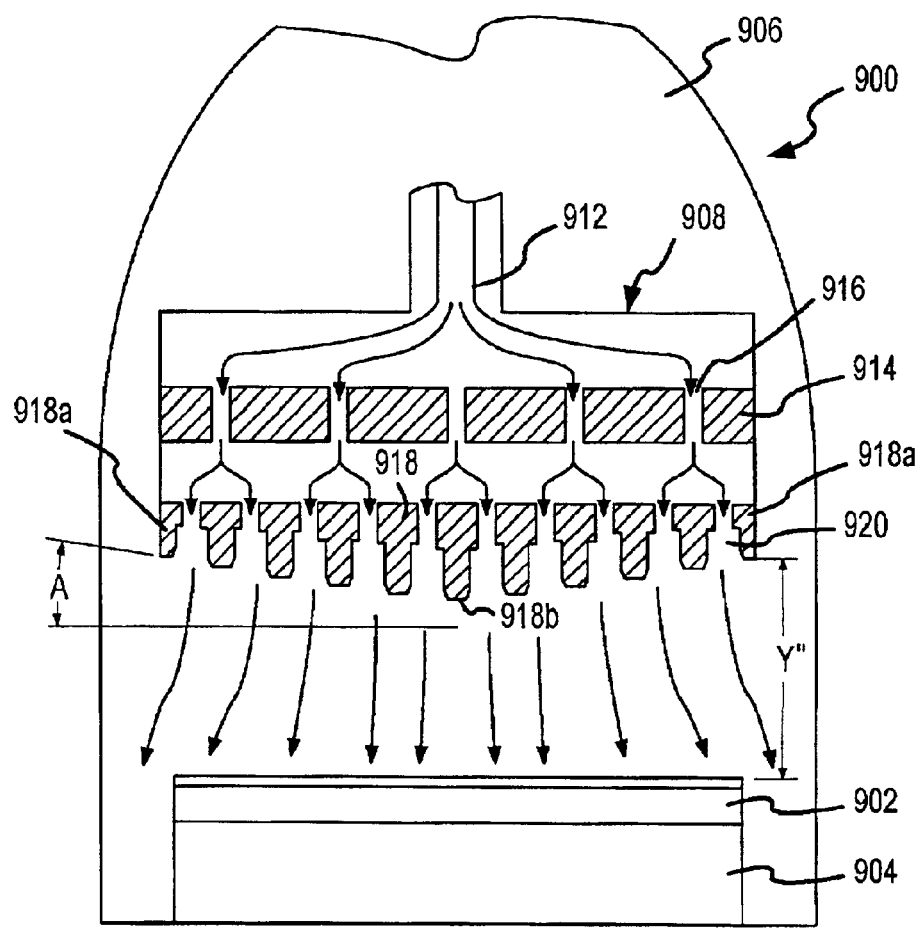
FIG. 13 shows a simplified cross-sectional view of an alternative embodiment of a high temperature deposition system in accordance with the present invention.

Accordingly, an alternative embodiment of a showerhead of the present invention may use a face plate having a tapered profile to avoid increased edge thickness of deposited materials at close face plate-to-wafer spacings. FIG. 13 shows a simplified cross-sectional view of an alternative embodiment of a high temperature deposition system in accordance with the present invention. Apparatus 900 comprises wafer 902 in contact with wafer support structure 904 and positioned within deposition chamber 906. Gas distribution showerhead 908 is positioned above wafer 902 and is separated from wafer 902 by gap Y".

Gas distribution showerhead 908 comprises process gas inlet 912 in fluid communication with blocker plate 914 having apertures 916. Gas distribution face plate 918 is positioned downstream of blocker plate 914. Face plate 918 receives a flow of process gas from blocker plate 914 and flows this gas through holes 920 to wafer 902.

As described above in connection with FIG. 4A, the close proximity of the face plate relative to the wafer may result in an enhanced flow of mass to the edges of the wafer.

Accordingly, the embodiment shown in FIG. 13 includes face plate 918 having a tapered profile. Specifically, edge portion 918a of face plate 918 is recessed relative to center portion 918b of face plate 918. Taper angle A represents the angle defined by the difference in thickness between face plate center and edge, and may range from about 0.5° to about 5°.

The use of a gas distribution showerhead featuring an improved thickness uniformity of deposited materials at close face plate-to-wafer spacings. TABLE A compares deposition rate, thickness uniformity, and thickness range for materials deposited at spacings of 100 and 75 mils, by tapered and flat face plates.

TABLE A

| GAP SPACING (mils) | TAPERED FACEPLATE | | | FLAT FACEPLATE | | |
|---|---|---|---|---|---|---|
| | Dep. Rate (Å/min) | 1 σ unif | Range | Dep. Rate (Å/min) | 1 σ unif | Range |
| 75 | 1950 | 7.3 | 12.7 | 2000 | 13.4 | 20.5 |
| 100 | 1600 | 4.6 | 7.6 | 1890 | 8.7 | 13.3 |

TABLE A indicates that deposition utilizing the tapered face plate results in formation of a layer of material having a more uniform center-to-edge thickness. While the data collected in TABLE A reflects deposition utilizing tapered and flat face plates having elongated slots, tapered face plates in accordance with embodiments of the present invention are not required to have elongated slots.

Figure 14:
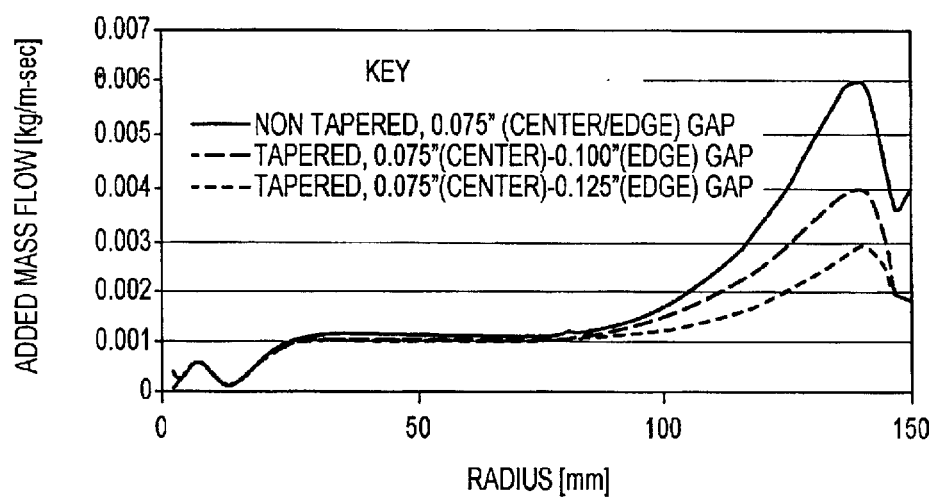
FIG. 14 plots calculated added mass flow versus distance from the center of the wafer for three different face plate profiles.

FIG. 14 plots calculated added mass flow versus distance from the center of the wafer for three different face plate profiles. FIG. 14 shows that the peak-to-valley variation in added mass across the wafer was reduced by 35% and 46% by tapering the gap by 0.025" and 0.050", respectively. The use of tapered face plate structures in accordance with embodiments of the present invention may result in deposition of material layers exhibiting a variation in center-to-edge thickness of 800 Å or less.

Only certain embodiments of the present invention are shown and described in the instant disclosure. One should understand that the present invention is capable of use in various other combinations and environments and is capable of changes and modification within the scope of the inventive concept expressed herein. For example, apparatuses and methods in accordance with embodiments of the present invention are not limited to processing semiconductor wafers of any particular size, and are useful for semiconductor fabrication processes involving 200 mm diameter wafers, 300 mm diameter wafers, or semiconductor wafers of other shapes and sizes.

Given the above detailed description of the present invention and the variety of embodiments described therein, these equivalents and alternatives along with the understood obvious changes and modifications are intended to be included within the scope of the present invention.

What is claimed is:

1. An apparatus for forming a material on a semiconductor wafer, the apparatus comprising:

a processing chamber defined by walls;

a wafer support positioned within the processing chamber and configured to receive a semiconductor wafer;

a processing gas supply; and a gas distribution showerhead overlying the wafer support and including a tapered face plate proximate to the wafer support, an edge of the tapered face plate exhibiting a reduced thickness relative to a thickness of a center of the face plate to create a taper angle, such that material deposited on a wafer in contact with the wafer support exhibits a uniform center-to-edge thickness, the tapered faceplate further comprising, an inlet portion configured to receive a flow of a processing gas, the inlet portion comprising an aperture having a width, and an outlet portion configured to convey the processing gas flow to a semiconductor wafer, the outlet portion comprising an elongated slot in fluid communication with the aperture.

2. The apparatus of claim 1 wherein the taper angle is between about 0.5° and 50°.

3. The apparatus of claim 1, wherein the elongated slot has a length at least one-half a thickness of the face plate.

4. The apparatus of claim 1, wherein the elongated slot is circular and continuous.

5. The apparatus of claim 1 wherein a width of the elongated slot is greater than the width of the aperture.

6. The apparatus of claim 5 wherein the width of the elongated slot is at least 2.25× larger than the width of the aperture.

7. An apparatus for forming a material on a semiconductor wafer, the apparatus comprising:

a processing chamber defined by walls;

a wafer support positioned within the processing chamber and configured to receive a semiconductor wafer;

a processing gas supply; and a gas distribution showerhead overlying the wafer support and including a tapered face plate proximate to the wafer support, the tapered face plate comprising, an inlet portion configured to receive a flow of a processing gas, the inlet portion comprising an aperture having a width, and an outlet portion configured to convey the processing gas flow to a semiconductor wafer, the outlet portion comprising an elongated slot in fluid communication with the aperture, wherein an edge of the tapered face plate exhibits a reduced thickness relative to a thickness of a center of the face plate to create a taper angle, such that material deposited on a wafer in contact with the wafer support exhibits a uniform center-to-edge thickness.

8. The apparatus of claim 7 the taper angle is between about 0.5° and 5°.

* * * * *